(12) United States Patent
Clemens et al.

(10) Patent No.: US 8,044,517 B2
(45) Date of Patent: Oct. 25, 2011

(54) ELECTRONIC COMPONENT COMPRISING PREDOMINANTLY ORGANIC FUNCTIONAL MATERIALS AND A METHOD FOR THE PRODUCTION THEREOF

(75) Inventors: Wolfgang Clemens, Puschendorf (DE); Adolf Bernds, Baiersdorf (DE); Alexander Friedrich Knobloch, Neunkirchen (DE)

(73) Assignee: PolyIC GmbH & Co. KG, Fürth (DE)

( * ) Notice: Subject to any disclaimer, the term of this patent is extended or adjusted under 35 U.S.C. 154(b) by 1317 days.

(21) Appl. No.: 10/523,216

(22) PCT Filed: Jul. 9, 2003

(86) PCT No.: PCT/DE03/02303
§ 371 (c)(1),
(2), (4) Date: Jul. 14, 2005

(87) PCT Pub. No.: WO2004/017439
PCT Pub. Date: Feb. 26, 2004

(65) Prior Publication Data
US 2006/0024947 A1 Feb. 2, 2006

(30) Foreign Application Priority Data
Jul. 29, 2002 (DE) .................................. 102 34 646

(51) Int. Cl.
*H01L 29/41* (2006.01)
*H01L 21/44* (2006.01)
(52) U.S. Cl. ............... 257/773; 257/741; 257/E21.589; 257/E23.152; 257/E23.165; 438/597; 438/665; 438/666
(58) Field of Classification Search .................... 257/40, 257/E51.001–E51.052, 739, 741, 773, 775, 257/E21.589, E23.152, E23.165; 438/82, 438/99, FOR. 135, 597, 618, 665–666, FOR. 342, 438/FOR. 369
See application file for complete search history.

(56) References Cited

U.S. PATENT DOCUMENTS
3,512,052 A 5/1970 MacIver et al.
(Continued)

FOREIGN PATENT DOCUMENTS
DE 33 38 597 5/1985
(Continued)

OTHER PUBLICATIONS
Kawase, T., et al. "Inkjet Printed Via-Hole Interconnections and Resistors for All-Polymer Transistor Circuits." Adv. Mater., vol. 13, No. 21 (Nov. 2, 2001): pp. 1601-1605.*
(Continued)

*Primary Examiner* — Matthew W Such
(74) *Attorney, Agent, or Firm* — Carella, Byrne et al.; Elliott M. Olstein; William Squire

(57) ABSTRACT

An electronic component comprises a plurality of layers at least two of which comprise predominantly organic functional materials with improved through-plating through certain of the layers. The through-plating is formed in one embodiment by a disruption element on a first lower layer which results in a void in the subsequently applied layers, which void is filled with a material which may be conductive to form the through plating. In a second embodiment, the through plating is formed on the first lower layer prior to the subsequent application of the other layers, in the form of a free-standing truncated frusto-conical raised portion, and forms a disruption or non-wetting element for the subsequently applied other layers, formed on the first lower layer and which are engaged with and surround the through plating after their application.

21 Claims, 2 Drawing Sheets

U.S. PATENT DOCUMENTS

| | | | |
|---|---|---|---|
| 3,769,096 A | 10/1973 | Ashkin | |
| 3,955,098 A | 5/1976 | Kawamoto | |
| 4,302,648 A | 11/1981 | Sado et al. | |
| 4,340,657 A | 7/1982 | Rowe | |
| 4,442,019 A | 4/1984 | Marks | |
| 4,865,197 A | 9/1989 | Craig | |
| 4,914,056 A * | 4/1990 | Okumura | 438/629 |
| 4,926,052 A | 5/1990 | Hatayama | |
| 4,937,119 A | 6/1990 | Nikles et al. | |
| 5,128,746 A * | 7/1992 | Pennisi et al. | 257/738 |
| 5,173,835 A | 12/1992 | Cornett et al. | |
| 5,206,525 A | 4/1993 | Yamamoto et al. | |
| 5,259,926 A | 11/1993 | Kuwabara et al. | |
| 5,321,240 A | 6/1994 | Takahira | |
| 5,347,144 A | 9/1994 | Garnier et al. | |
| 5,364,735 A | 11/1994 | Akamatsu et al. | |
| 5,395,504 A | 3/1995 | Hoffman et al. | |
| 5,457,881 A * | 10/1995 | Schmidt | 29/852 |
| 5,480,839 A | 1/1996 | Ezawa et al. | |
| 5,486,851 A | 1/1996 | Gehner et al. | |
| 5,502,396 A | 3/1996 | Desarzens | |
| 5,546,889 A | 8/1996 | Wakita et al. | |
| 5,569,879 A | 10/1996 | Gloton et al. | |
| 5,574,291 A | 11/1996 | Dodabalapur et al. | |
| 5,578,513 A | 11/1996 | Maegawa | |
| 5,580,794 A | 12/1996 | Allen | |
| 5,625,199 A | 4/1997 | Baumbach et al. | |
| 5,629,530 A | 5/1997 | Brown et al. | |
| 5,630,986 A | 5/1997 | Miller et al. | |
| 5,652,645 A | 7/1997 | Jain | |
| 5,691,089 A | 11/1997 | Smayling | |
| 5,705,826 A | 1/1998 | Aratani et al. | |
| 5,729,428 A | 3/1998 | Sakata et al. | |
| 5,854,139 A | 12/1998 | Kondo et al. | |
| 5,869,972 A | 2/1999 | Birch et al. | |
| 5,883,397 A | 3/1999 | Isoda et al. | |
| 5,892,244 A | 4/1999 | Tanaka et al. | |
| 5,946,551 A | 8/1999 | Dimitrakopoulos | |
| 5,967,048 A | 10/1999 | Fromson et al. | |
| 5,970,318 A | 10/1999 | Choi et al. | |
| 5,973,598 A | 10/1999 | Beigel | |
| 5,985,752 A * | 11/1999 | Chang | 438/637 |
| 5,997,817 A | 12/1999 | Crismore et al. | |
| 5,998,805 A | 12/1999 | Shi et al. | |
| 6,036,919 A | 3/2000 | Thym et al. | |
| 6,045,977 A | 4/2000 | Chandross et al. | |
| 6,060,338 A | 5/2000 | Tanaka et al. | |
| 6,072,716 A | 6/2000 | Jacobson et al. | |
| 6,083,104 A | 7/2000 | Choi | |
| 6,087,196 A | 7/2000 | Sturm et al. | |
| 6,132,853 A * | 10/2000 | Noddin | 428/209 |
| 6,133,066 A * | 10/2000 | Murakami | 438/108 |
| 6,133,835 A | 10/2000 | De Leeuw et al. | |
| 6,150,668 A | 11/2000 | Bao et al. | |
| 6,197,663 B1 | 3/2001 | Chandross et al. | |
| 6,207,472 B1 | 3/2001 | Calligari et al. | |
| 6,215,130 B1 | 4/2001 | Dodabalapur | |
| 6,221,553 B1 | 4/2001 | Wolk et al. | |
| 6,251,513 B1 | 6/2001 | Hyatt | |
| 6,284,562 B1 | 9/2001 | Batlogg et al. | |
| 6,300,141 B1 | 10/2001 | Segal et al. | |
| 6,321,571 B1 | 11/2001 | Themont et al. | |
| 6,322,736 B1 | 11/2001 | Bao et al. | |
| 6,329,226 B1 | 12/2001 | Jones et al. | |
| 6,330,464 B1 | 12/2001 | Colvin et al. | |
| 6,335,539 B1 | 1/2002 | Dimitrakopoulos et al. | |
| 6,340,822 B1 | 1/2002 | Brown et al. | |
| 6,344,662 B1 | 2/2002 | Dimitrakopoulos et al. | |
| 6,358,437 B1 * | 3/2002 | Jonas et al. | 252/500 |
| 6,362,509 B1 | 3/2002 | Hart | |
| 6,384,804 B1 | 5/2002 | Dodabalapur et al. | |
| 6,400,024 B1 * | 6/2002 | Drury et al. | 257/759 |
| 6,403,396 B1 | 6/2002 | Gudesen et al. | |
| 6,429,450 B1 | 8/2002 | DeLeeuw et al. | |
| 6,432,739 B1 | 8/2002 | Gudesen et al. | |
| 6,498,114 B1 | 12/2002 | Amundson et al. | |
| 6,517,995 B1 | 2/2003 | Jacobson et al. | |
| 6,555,840 B1 | 4/2003 | Hudson et al. | |
| 6,593,690 B1 | 7/2003 | McCormick et al. | |
| 6,603,139 B1 | 8/2003 | Tessler et al. | |
| 6,621,098 B1 | 9/2003 | Jackson et al. | |
| 6,635,406 B1 * | 10/2003 | De Leeuw et al. | 430/311 |
| 6,852,583 B2 | 2/2005 | Bernds et al. | |
| 6,903,958 B2 | 6/2005 | Bernds et al. | |
| 7,176,040 B2 * | 2/2007 | Sirringhaus et al. | 438/6 |
| 7,244,669 B2 * | 7/2007 | Sirringhaus et al. | 438/535 |
| 2002/0004180 A1 * | 1/2002 | Hotta et al. | 430/311 |
| 2002/0017710 A1 * | 2/2002 | Kurashima et al. | 257/686 |
| 2002/0018911 A1 | 2/2002 | Bernius et al. | |
| 2002/0022284 A1 | 2/2002 | Heeger et al. | |
| 2002/0025391 A1 | 2/2002 | Angelopoulos | |
| 2002/0053320 A1 | 5/2002 | Duthaler | |
| 2002/0056839 A1 | 5/2002 | Joo et al. | |
| 2002/0068392 A1 | 6/2002 | Lee et al. | |
| 2002/0129894 A1 * | 9/2002 | Liu et al. | 156/291 |
| 2002/0130042 A1 | 9/2002 | Stiene et al. | |
| 2002/0170897 A1 | 11/2002 | Hall | |
| 2002/0195644 A1 | 12/2002 | Dodabalapur et al. | |
| 2003/0029831 A1 * | 2/2003 | Kawase | 216/27 |
| 2003/0059987 A1 | 3/2003 | Sirringhaus et al. | |
| 2003/0102472 A1 * | 6/2003 | Kelley et al. | 257/40 |
| 2003/0112576 A1 | 6/2003 | Brewer et al. | |
| 2003/0175427 A1 | 9/2003 | Loo et al. | |
| 2003/0186558 A1 * | 10/2003 | Brenner | 438/760 |
| 2004/0002176 A1 | 1/2004 | Xu | |
| 2004/0013982 A1 | 1/2004 | Jacobson et al. | |
| 2004/0026689 A1 | 2/2004 | Bernds et al. | |
| 2004/0084670 A1 | 5/2004 | Tripsas et al. | |
| 2004/0211329 A1 | 10/2004 | Funahata et al. | |

FOREIGN PATENT DOCUMENTS

| | | |
|---|---|---|
| DE | 424 38 32 | 6/1994 |
| DE | 4243832 | 6/1994 |
| DE | 198 52 312 | 5/1999 |
| DE | 198 16 860 | 11/1999 |
| DE | 199 18 193 | 11/1999 |
| DE | 198 51703 | 5/2000 |
| DE | 100 06 257 | 9/2000 |
| DE | 199 21 024 | 11/2000 |
| DE | 695 19 782 | 1/2001 |
| DE | 19933757 | 1/2001 |
| DE | 199 35 527 | 2/2001 |
| DE | 199 37 262 | 3/2001 |
| DE | 100 12 204 | 9/2001 |
| DE | 100 33 112 | 1/2002 |
| DE | 100 45 192 | 4/2002 |
| DE | 100 47 171 | 4/2002 |
| DE | 100 43204 | 4/2002 |
| DE | 100 58 559 | 5/2002 |
| DE | 100 61297 | 6/2002 |
| DE | 10061297 | 6/2002 |
| DE | 101 17 663 A1 | 10/2002 |
| DE | 101 20 687 | 10/2002 |
| DE | 102 19 905 | 12/2003 |
| EP | 0 108650 | 5/1984 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 418504 | 3/1991 |
| EP | 0 442123 | 8/1991 |
| EP | 0460242 | 12/1991 |
| EP | 0501456 A2 | 9/1992 |
| EP | 0501456 A3 | 9/1992 |
| EP | 0 511807 | 11/1992 |
| EP | 0 528662 | 2/1993 |
| EP | 0685985 | 12/1995 |
| EP | 0716458 | 6/1996 |
| EP | 0 785 578 A2 | 7/1997 |
| EP | 0 785 578 A3 | 7/1997 |
| EP | 0 786820 | 7/1997 |
| EP | 0 615 256 B1 | 9/1998 |
| EP | 0 966 182 | 12/1999 |
| EP | 0962984 | 12/1999 |
| EP | 0 979715 | 2/2000 |
| EP | 0981165 | 2/2000 |
| EP | 0989614 A2 | 3/2000 |

| | | |
|---|---|---|
| EP | 1 048 912 | 11/2000 |
| EP | 1 052 594 | 11/2000 |
| EP | 1 065 725 A2 | 1/2001 |
| EP | 1 065 725 A3 | 1/2001 |
| EP | 1 083 775 A1 | 3/2001 |
| EP | 1 102 335 A2 | 5/2001 |
| EP | 1 104 035 A2 | 5/2001 |
| EP | 1 103916 | 5/2001 |
| EP | 1 134 694 | 9/2001 |
| EP | 1224999 | 7/2002 |
| EP | 1 237 207 | 9/2002 |
| EP | 1 318 084 | 6/2003 |
| FR | 2793089 | 11/2000 |
| GB | 723598 | 2/1955 |
| GB | 2 058 462 | 4/1981 |
| JP | 54069392 | 6/1979 |
| JP | 60117769 | 6/1985 |
| JP | 61167854 | 7/1986 |
| JP | 362065477 A | 3/1987 |
| JP | 01169942 | 7/1989 |
| JP | 01169942 | 10/1989 |
| JP | 04279046 A * | 10/1992 |
| JP | 05152560 | 6/1993 |
| JP | 05259434 | 10/1993 |
| JP | 05347422 | 12/1993 |
| JP | 08197788 | 8/1995 |
| JP | 09064049 A * | 3/1997 |
| JP | 09083040 | 3/1997 |
| JP | 09320760 | 12/1997 |
| JP | 10026934 | 1/1998 |
| JP | 2969184 B | 11/1999 |
| JP | 2001085272 | 3/2001 |
| JP | 2001250876 A * | 9/2001 |
| WO | WO 93 16491 | 8/1993 |
| WO | WO 94/17556 | 8/1994 |
| WO | WO 95/06240 | 3/1995 |
| WO | WO 95/31831 | 11/1995 |
| WO | WO 96 02924 | 2/1996 |
| WO | WO 96/19792 | 6/1996 |
| WO | WO 97/12349 | 4/1997 |
| WO | WO 97/18944 | 5/1997 |
| WO | WO 98 18156 | 4/1998 |
| WO | WO 98 18186 | 4/1998 |
| WO | WO 98/40930 | 9/1998 |
| WO | WO 99/07189 | 2/1999 |
| WO | WO 99/10929 | 3/1999 |
| WO | WO 99 10929 | 3/1999 |
| WO | WO 99 10939 | 3/1999 |
| WO | WO 99 21233 | 4/1999 |
| WO | WO 99 30432 | 6/1999 |
| WO | WO 99 39373 | 8/1999 |
| WO | WO 99 40631 | 8/1999 |
| WO | WO 99/53371 | 10/1999 |
| WO | WO 99 54936 | 10/1999 |
| WO | WO 99/54936 | 10/1999 |
| WO | WO 99/66540 | 12/1999 |
| WO | WO 00/33063 | 6/2000 |
| WO | WO 00/36666 | 6/2000 |
| WO | WO 00 79617 | 12/2000 |
| WO | WO 01/03126 | 1/2001 |
| WO | WO 01/06442 | 1/2001 |
| WO | WO 01/08241 | 2/2001 |
| WO | WO 01 15233 | 3/2001 |
| WO | WO 01/17029 | 3/2001 |
| WO | WO 01 17041 | 3/2001 |
| WO | WO 01/27998 | 4/2001 |
| WO | WO 01/46987 | 6/2001 |
| WO | WO 01 47045 | 6/2001 |
| WO | WO 0146987 A2 * | 6/2001 |
| WO | WO 0147044 A2 | 6/2001 |
| WO | WO 0147044 A3 | 6/2001 |
| WO | WO 01/73109 A2 | 10/2001 |
| WO | WO 01/73109 A3 | 10/2001 |
| WO | WO 02/05360 | 1/2002 |
| WO | WO 02/05361 | 1/2002 |
| WO | WO 02/15264 | 2/2002 |
| WO | WO 02/19443 | 3/2002 |
| WO | WO 02 19443 | 3/2002 |
| WO | WO 02/29912 | 4/2002 |
| WO | WO 02/43071 | 5/2002 |
| WO | WO 02/47183 | 6/2002 |
| WO | WO 02/065557 | 8/2002 |
| WO | WO 02/065557 A1 | 8/2002 |
| WO | WO 02/071139 | 9/2002 |
| WO | WO 02/071505 | 9/2002 |
| WO | WO 02/076924 | 10/2002 |
| WO | WO 02/091495 | 11/2002 |
| WO | WO 02095805 A2 | 11/2002 |
| WO | WO 02095805 A3 | 11/2002 |
| WO | WO 02/099907 | 12/2002 |
| WO | WO 02/099908 | 12/2002 |
| WO | WO 03/046922 | 6/2003 |
| WO | WO 03/067680 | 8/2003 |
| WO | WO 03/069552 | 8/2003 |
| WO | WO 03/081671 | 10/2003 |
| WO | WO 03/095175 | 11/2003 |
| WO | WO 2004/032257 | 4/2004 |
| WO | WO 2004/042837 | 5/2004 |
| WO | WO 2004/042837 A2 | 5/2004 |
| WO | WO 2004/042837 A3 | 5/2004 |
| WO | WO 2004/007194 A2 | 6/2004 |
| WO | WO 2004/007194 A3 | 6/2004 |
| WO | WO 2004/047144 A2 | 6/2004 |
| WO | WO 2004/047144 A3 | 6/2004 |
| WO | WO 2004/083859 | 9/2004 |

OTHER PUBLICATIONS

Translation of JP 04279046 A. (Publication Date Oct. 1992).
Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.
Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.
Gosain, D.P., "Excimer laser crystallized poly-Si TFT's on plastic substrates", Second International Symposium on Laser Precision Microfabrication, May 16-18, 2001, Singapore, vol. 4426, pp. 394-400.
Harsanyi G. et al, "Polytronics for biogtronics:unique possibilities of polymers in biosensors and BioMEMS", IEEE Polytronic 2002 Conference, Jun. 23, 2002, pp. 211-215.
Koezuka, H. et al., "Macromolecular Electronic Device", Mol. Cryst. Liq. Cryst. 1994, vol. 2555, pp. 221-230.
Lu, Wen et al., "Use of Ionic Liquids for π-Conjugated Polymer Electrochemical Devices", Science, vol. 297, 2002, pp. 983-987/.
Shaheen, S.E., et al., "Low band-gap polymeric photovoltaic devices", Synthetic Metals, vol. 121, 2001, pp. 1583-1584.
Takashima, W. et al., Electroplasticity Memory Devices Using Conducting Polymers and Solid Polymer Electrolytes, Polymer International, Melbourne, 1992, pp. 249-253.
Velu, G. et al. "Low Driving Voltages and Memory Effect in Organic Thin-Film Transistors With a Ferroelectric Gate Insulator", Applied Physics Letters, American Institute of Physics, New York, vol. 79, No. 5, 2001, pp. 659-661.
Wang, Yading et al., "Electrically Conductive Semiinterpenetrating Polymer Networks of Poly(3-octylthiophene)", Macromolecules 1992, vol. 25, pp. 3284-3290.
U.S. Appl. No. 10/523.216, Adolf Bernds et al.
U.S. Appl. No. 10/523,487, Wolfgang Clemens et al.
U.S. Appl. No. 10/533,756, Wolfgang Clemens et al.
U.S. Appl. No. 10/534,678, Wolfgang Clemens et al.
U.S. Appl. No. 10/535,448, W. Clemens et al.
U.S. Appl. No. 10/535,449, Walter Fix et al.
U.S. Appl. No. 10/344,926, filed Feb. 12, 2004, Adolf Bernds et al.
U.S. Appl. No. 10/541,815, Axel Gerlt et al.
U.S. Appl. No. 10/541,956, Wolfgang Clemens et al.
U.S. Appl No. 10/541,957, Walter Fix et al.
U.S. Appl. No. 10/543,561, Wolfgang Clemens et al.
U.S. Appl. No. 10/542,678, Adolf Bernds et al.
U.S. Appl. No. 10/542,679, Adolf Bernds et al.

Dai, L. et al., "Conjugation of Polydienes by Oxidants Other Than Iodine", Elsevier Science S.A., Synthetic Metals 86 (1997) 1893-1894.

Dai, L. et al., "I$_2$-Doping" of 1,4-Polydienes, Elsevier Science S.A., Synthetic Metals 69 (1995), pp. 563-566.

Kawase, T. et al., "Inkjet Printed Via-Hole Interconnections and Resistors for All-Polymer Transistor Circuits", Advanced Materials 2001,13, No. 21, Nov. 2, 2001, pp. 1601-1605.

Qiao, X. et al., "The FeCl3-doped poly3-alkithiophenes) in solid state", Elsevier Science, Synthetic Metals 122 (2001) pp. 449-454.

Garnier F et al:, "Vertical Devices Architecture by Molding Of Organic-Based Thin Film Transistor", Applied Physics Letters, American Institute of Physics. XP000784120, issn: 0003-6951 abbildung 2, (1998).

Collet J. et al:, Low Voltage, 30 NM Channel Length, Organic Transistors With a Self-Assembled Monolayer As Gate Insulating Films:, Applied Physics Letters, American Institute of Physics. New York, US, Bd 76, Nr. 14, Apr. 3, 2000, Seiten 1941-1943, XP000950589, ISSN:0003-6951, das ganze Dokument.

Hwang J D et al:, "A Vertical Submicron Slc thin film transistor", Solid State Electronics, Elsevier Science Publishers, Barking, GB, Bd. 38, NR. 2, Feb. 1, 1995, Seiten 275-278, XP004014040, ISSN:0038-1101, Abbildung 2.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.

"Short-Channel Field-Effect Transistor", IBM Technical Disclosure Bulletin, IBM Corp., New York, US, Bd. 32, Nr. 3A, Aug. 1, 1989, Seiten 77-78, XP000049357, ISSN:0018-8689, das ganze Dokument.

Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.

Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, Jul. 5, 1999, Seiten 741-745, P000851834, ISSN: 0935-9648, das ganze Dokument.

Miyamoto, Shoichi et al:, Effect of LDD Structure and Channel Poly-Si Thinning on a Gate-All-Around TFT (GAT) for SRAM's; IEEE Transactions on Electron Devices. vol. 46, No. 8, Aug. 1999.

Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.

Zangara L: "Metall Statt Halbleiter, Programmierung Von Embedded ROMS Ueber Die Metallisierungen", Elektronik, Franzis Verlag GMBH, Munchen, DE, Bd. 47, Nr. 16, Aug. 4, 1998, Seiten 52-55, XP000847917, ISSN: 0013-5658, Seite 52, rechtes Plate, Zeile 7-Seite 53, linke Spalte, Zeile 14; Abbildungen 1,2.

Hergel, H. J.: "Pld-Programmiertechnologien", Elektronik, Franzis Verlag GMBH. Munchen, DE, Bd 41, Nr. 5, Mar. 3, 1992, Seiten 44-46, XP000293121, ISSN: 0013-5658, Abbildungen 1-3.

Oelkrug, D. et al, "Electronic spectra of self-organized oligothiophene films with 'standing' and 'lying' molecular units", Elsevier Science S.A., Thin Solid Films 284-285 (1996) 267-270.

Patent Abstracts of Japan, vol. 009, No. 274 (E-354), Oct. 31, 1985 & JP 60 117769 A (Fujitsu KK), Jun. 25, 1985 Zusammenfassung.

Chen, X. Linda, et al., "Morphological and Transistor Studies of Organic Molecular Semiconductors with Anisotropic Electrical Characteristics", American Chemical Society, Chem. Mater. 2001, 13, 1341-1348.

Drury et al., "Low-Cost All-Polymer Integrated Circuits", American Institute of Physics, Applied Physics Letters, 1998, vol. 73, No. 1, pp. 108-110, Jul. 6, 1998.

Sandberg, henrik et al., "Ultrra-thin Organic Films for Field Effect Transistors", Organic Field Effect Transistors, Proceedings of SPIE vol. 4466 (201) SPIE, pp. 35-43, (2001).

Garnier, F. et al, "All-Polymer Field-Effect Transistor Realized by Printing Techniques", Science, American Association for the Advancement of Science, US, vol. 265, Sep. 16, 1994, pp. 1684-1686.

Assadi A, et al:, Field-Effect Mobility of Poly (3-Hexylthiophene) Dept. of Physics and Measurement Technology, Received Mar. 3, 1988; accepted for Publication May 17, 1988.

Bao, Z. et al., "High-Performance Plastic Transistors Fabricatecd by Printing Techniques", Chem. Mater vol. 9, No. 6, 1997, pp. 1299-1301.

Hebner, T.R. et al., Ink-jet printing of doped polymers for organic light emitting devices:, American Institute of Physics, Applied Physics Letters, vol. 72, No. 5, Feb. 2, 1998, pp. 519-521.

Angelopoulos M et al, "In-Situ Radiation Induced Doping", Mol. Cryst. Liq. Cryst. 1990, vol. 189, pp. 221-225.

Dai, L. et al, Photochemical Generation of Conducting Pattersn in Polybutadiene Films:, Macromolecules, vol. 29, No. 1, 1996, pp. 282-287, XP 001042019, the whole document.

Roman et al., Polymer Diodes With High Rectification:, Applied Physics Letters, vol. 75, No. 21, Nov. 22, 1999.

Patent Abstracts of Japan, vol. 010, No. 137, May 21, 1986 (JP 361001060A).

Schoebel, "Frequency Conversion with Organic-On-Inorganic Heterostructured Diodes", Extended Abstracts of the International Conference on Solid State Devices and Materials, Sep. 1, 1997.

Braun D., et al, "Visible light emission from semiconducting polymer diodes", American Institute of Physics, Applied Physics Letters 58, May 6, 1991, pp. 1982-1984.

Yu, G. et al., "Dual-function semiconducting polymer devices: Light-emitting and photodetecting diodes", American Institute of Physics, Applied Physics Letter 64, Mar. 21, 1994, pp. 1540-1542.

Lucent Technologies, "Innovation marks significant milestone in the development of electronic paper", Cambridge, MA and Murray Hill, NJ, Nov. 20, 2000. XP-002209726.

Garnier et al., "Conjugated Polymers and Oligomers as Active Material for Electronic Devices", Synthetic Metals, vol. 28, 1989.

Gelinck, G.H. et al., "High-Performance All-Polymer Integrated Circuits", Applied Physics Letters, v. 77, 2000, pp. 1487-1489.

Zheng, Xiang-Yang et al., "Electrochemical Patterning of the Surface of Insulators with Electrically Conductive Polymers", J. Electrochem. Soc., v. 142, 1995, pp. L226-L227.

Lidzey, D. G. et al., "Photoprocessed and Micropatterned Conjugated Polymer LEDs", Synthetic Metals, V. 82, 1996, pp. 141-148.

Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.

Rost, Henning et al., "All-Polymer Organic Field Effect Transistors", Proc. Mat. Week, CD, 2001, pp. 1-6.

Manuelli, Alessandro et al., "Applicability of Coating Techniques for the Production of Organic Field Effect Transistors", IEEE Polytronic 2002 Conference, 2002, pp. 201-204.

Ullman, A. et al., "High Performance Organic Field-Effect Transistors and Integrated Inverters", Mat. Res. Soc. Symp. Proc., v. 665, 2001, pp. 265-270.

Fix, W. et al., "Fast Polymer Integrated Circuits Based on a Polyfluorene Derivative", ESSDERC 2002, 2002, pp. 527-529.

Knobloch, A. et al., "Printed Polymer Transistors", Proc. Polytronic, v. 84, 2001, pp. 84-89.

Ficker, J. et al., "Dynamic and Lifetime Measurements of Polymer OFETS and Integrated Plastic Circuits," Proc. of SPIE, v. 466, 2001, pp. 95-102.

Clemens, W. et al., "Vom Organischen Transistor Zum Plastik-Chip," Physik Journal, V. 2, 2003, pp. 31-36.

Crone, B. et al, "Large-scale complementary Integrated circuits based on Organic transistors", Nature, vol. 403, Feb. 3, 2000, pp. 521-523.

Fix, W., et al., "Fast polymer integrated circuits", American Institute of Physics, Applied Physics Letters, vol. 81, No. 89, Aug. 2002, pp. 1735-1737.

Dodabalapur, A. et al., Organic smart pixels, American Institute of Physics; Applied Physics Letters, vol. 73, No. 2, Jul. 13, 1998, pp. 142-144.

Halls, J.J. M., et al., "Efficient photodiodes from interpenetrating polymer networks", Nature, vol. 376, Aug. 10, 1995, pp. 498-500.

Brown, A.R. et al., "Field-effect transistors made from solution-processed organic semiconductors", Elsevier Science, S.A., Synthetic Metals 88 (1997) pp. 37-55.

Brown, A.R., "Logic Gates Made from Polymer Transistors and Their Use in Ring Oscillators", Science, vol. 270, Nov. 10, 1995, pp. 972-974.

Klauk, H. et al., "Pentacene Thin Film Transistors and Inverter Circuits", 1997 International Exectron Devices Meeting Technical Digest, pp. 539-542, Dec. 1997.

Klauk, H. et al., "Fast Organic Thin Film Transistor Circuits", IEEE Electron Device Letters, vol. 20, No. 6, pp. 289-291, (Jun. 1999).

Bao, Z. et al., "Organic and Polymeric Materials for the Fabrications of Thin Film Field-Effect Transistors", paper presented at the meeting of American Chemical Society, Division of Polymer Chemistry, XX, XX, Bd. 39, Nr. 1, Mar. 29, 1998, P001032497, ISSN: 0032-3934 das ganze Dokument.

Patent Abstracts of Japan, vol. 013, No. 444 (E-828), Oct. 5, 1989 & JP 01 169942 A (Hitachi Ltd), Jul. 5, 1989.

U.S. Appl. No. 10/332,140, Method for the Production and Configuration of Organic Field-Effect Transistors (OFET), Adolf Bernds et al.

U.S. Appl. No. 10/344,951, Organic Field-Effect Transistor (OFET), A Production Method Therefor, An Integrated Circuit Constructed From the Same and Their Uses, Adolf Bernds et al.

U.S. Appl. No. 10/362,932, Organic Field Effect Transistor, Method for Structuring an OFET and Integrated Circuit, Adolf Bernds et al.

U.S. Appl. No. 10/380,113, Organic Rectifier, Circuit, RFID Tag and Use of an Organic Rectifier, Adolf Bernds et al.

U.S. Appl. No. 10/380,206, Organic Memory, Identification Marker (RFID-TAG) with Organic Memory and Uses of an Organic Memory, Adolf Bernds et al.

U.S. Appl. No. 10/381,032, Electrode and/or Conductor Track for Organic Components and Production Method Thereof, Adolf Bernds et al.

U.S. Appl. No. 10/433,959, Organic Field Effect Transistor, Method for Structuring an OFET and Integrated Circuit, Adolf Bernds.

U.S. Appl. No. 10/433,961, Device for Detecting and/or Transmitting at Least One Environmental Influence, Method for Producing Said Device and Use Thereof, Wolfgang Clemens et al.

U.S. Appl. No. 10/467,636, Organic Field Effect Transistor With a Photostructured Gate Dielectric, Method for the Production and Use Thereof in Organic Electronics, Adolf Bernds et al.

U.S. Appl. No. 10/473,050, Device With At Least Two Organic Electronic Components and Method for Producing the Same, Adolf Bernds et al.

U.S. Appl. No. 10/479,234, Organic Field Effect Transistor, Method for Production and Use Thereof in the Assembly of Integrated Circuits, Adolf Bernds et al.

U.S. Appl. No. 10/479,238, Method for Producing Conductive Structures by Means of Printing Technique, and Active Components Produced Therefrom for Integrated Circuits, Adolf Bernds et al.

U.S. Appl. No. 10/492,922, Insulator for An Organic Electronic Component, Erwann Guillet et al.

U.S. Appl. No. 10/492,923, Electronic Unit, Circuit Design for the Same and Production Method, Wolfgang Clemens et al.

U.S. Appl. No. 10/498,610, Organic Field Effect Transistor with Offset Threshold Voltage and the Use Thereof, Walter Fix et al.

U.S. Appl. No. 10/508,640, Logic Component Comprising Organic Field Effect Transistors, Walter Fix et al.

U.S. Appl. No. 10/508,737, Device and Method for Laser Structuring Functional Polymers and, Adolf Bernds et al.

U.S. Appl. No. 10/517,750, Substrate for an Organic Field Effect Transistor, Use of the Substrate, Method of Increasing the Charge Carrier Mobility and Organic Field Effect Transistor (OFET), Wolfgang Clemens et al.

Fraunhofer Magazin, "Polytronic: Chips voon der Rolle", Nr. 4, 2001, pp. 8-13.

deLeeuw, D.M. et al., "Polymeric Integrated Circuits and Light-Emitting Diodes", IEEE 1997, pp. 331-337.

Schrodner, S. et al., "Plastic Electronics Based on Semiconducting Polymers", Session 4: Polymer Electronic Devices II, pp. 91-94, (2001).

Lowe, J. et al., "Poly(3(2-acetoxyethyl)thiophene): A model polymer for acid-catalyzed lithography", Elsevier Science S.A., 1997, Synthetic Metals 85 pp. 1427-1430.

U.S. Appl. No. 10/523,487, Electronic device, Wolfgang Clemens et al.

U.S. Appl. No. 10/524,646, Organic component for overvoltage protection and associated circuit, Walter Fix et al.

U.S. Appl. No. 10/344,951, Adolf Bernds et al.

U.S. Appl. No. 10/362,932, filed Oct. 2, 2003, Adolf Bernds et al.

U.S. Appl. No. 10/380,113, filed Sep. 25, 2003, Adolf Bernds et al.

U.S. Appl. No. 10/380,206, Adolf Bernds et al.

U.S. Appl. No. 10/381,032, Adolf Bernds et al.

U.S. Appl. No. 10/433,959, Adolf Bernds.

U.S. Appl. No. 10/433,961, Wolfgang Clemens et al.

U.S. Appl. No. 10/451,108, Mark Giles et al.

U.S. Appl. No. 10/467,636, Adolf Bernds et al.

U.S. Appl. No. 10/473,050, Adolf Bernds et al.

U.S. Appl. No. 10/479,234, filed Dec. 30, 2004, Adolf Bernds et al.

U.S. Appl. No. 10/479,238, Adolf Bernds et al.

U.S. Appl. No. 10/492,922, Erwann Buillet et al.

U.S. Appl. No. 10/492,923, filed Dec. 23, 2004, Wolfgang Clemens et al.

U.S. Appl. No. 10/498,610, Walter Fix et al.

U.S. Appl. No. 10/508,640, Walter Fix et al.

U.S. Appl. No. 10/508,737, Adolf Bernds et al.

U.S. Appl. No. 10/517,750, Wolfgang Clemens et al.

U.S. Appl. No. 10/523,216, Adolf Bernds et al.

U.S. Appl. No. 10/523,487, Wolfgang Clemens et al.

U.S. Appl. No. 10/524,646, Walter Fix et al.

* cited by examiner

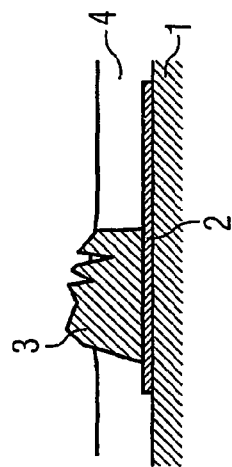
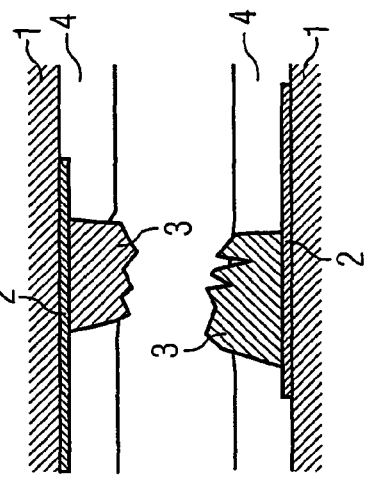
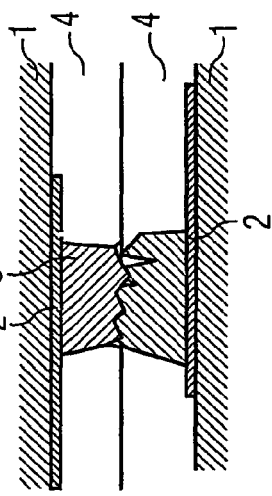
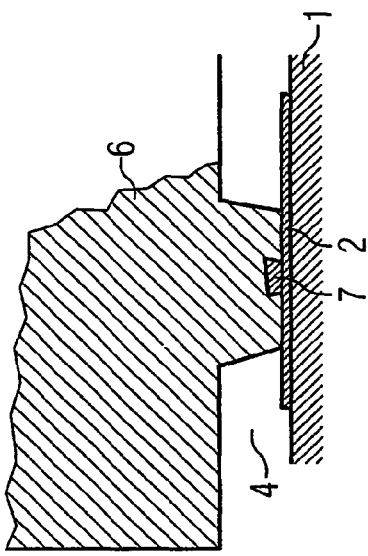

ELECTRONIC COMPONENT COMPRISING PREDOMINANTLY ORGANIC FUNCTIONAL MATERIALS AND A METHOD FOR THE PRODUCTION THEREOF

The invention concerns an electronic component comprising predominantly organic functional materials with improved through-plating.

Components are known for example from GR 2001P03239; 2001P20024 in so-called 'polymer electronics'. This means the new electronics which are not based on the traditionally known silicon-based conducting materials and which consist of substantially organic materials, in particular layers of organic plastic materials. The system for producing through-platings (vias formation) for polymer electronics permits conductive connections to be made between layers in different levels of components. In that situation a through-plating passes through one or more insulating or semiconductor intermediate layers, that is to say so-called 'central functional layers'. Those through-platings are essential for the production of logic-capable integrated circuits. They can be produced both with a printing procedure and also in conventional manner by means of optical lithography. When using a printing process, that process step can be integrated into mass production, which is essential in particular in the production of low-cost articles.

In the production of such electronic components the predominantly organic material is applied by way of thin film processes. Because the thin films have a high level of sensitivity in relation to mechanical stress and/or chemical solvents, high demands are made on the processes for forming the through-platings. It will be appreciated that those high demands are reflected in the production costs. Hitherto through-platings have been produced on the finished thin layers, in which case the risk of the thin layers being damaged weighs very heavily because the functionality of the entire component is brought into question as soon as one of the functional layers is damaged.

Therefore an object of the invention is to provide a mass production-compatible process for the production of at least one through-plating, which takes account of the properties of the delicate thin layers of organic material. Another object of the invention is to provide an electronic component which has at least one through-plating which was applied prior to the insulating layer.

The subject of the invention is therefore an electronic component with predominantly organic functional layers, which as at least one through-plating whose cross-sectional profile is so characteristic that it can be seen thereon that at least one lower layer was locally treated prior to the application of at least one central functional layer. The subject of the invention is also a process for the production of at least one through-plating of an electronic component comprising predominantly organic material, wherein the through-plating is formed prior to the application of the insulating layer.

Hitherto vias have always been formed by a procedure whereby holes are subsequently produced in existing layers by drilling, etching away or usual methods involving non-cross-linking such as lithography and so forth, the holes then being filled with conducting material to form the through-plating. That mostly involves a uniform cross-section in respect of the through-plating formed, and that cross-section can be characteristically and easily recognized on the finished product by means of a cross-sectional profile.

The method proposed herein for the first time, for applying the through-plating (VIAS) on the substrate, the conducting and/or semiconducting layer, at any event prior to the layer which is to be through-plated and which therefore is generally insulating, provides through-platings which at least in accordance with some embodiments are of a cross-sectional profile which tapers from below upwardly, comparable to a truncated cone. The contours of the vias are generally also of a shape which is typical of the kind of manufacture, for example printing. The subsequent layer which are to be through-plated are substantially adapted around the vias to that shape. The contour shape is not sharply drawn and/or even of a serrated configuration for example in accordance with an embodiment—considered microscopically—, whereas the contours of the conventional vias which can be obtained by subsequent drilling generally have sharp contours.

In accordance with an embodiment the vias are formed in the configuration of free-standing raised portions. Through-plating in that case is effected only with the application of the thin and/or insulating layer. It is advantageous if the surface of the vias is rough for later contact with the upper conductor. If the insulating layer or layers involves a thin film or films, the through-platings are produced in succession automatically because the film of organic material breaks open at the through-plating points, even if the raised portion is not high by the entire thickness of the layer. The holes produced in that way in the insulating film can produce an electrical connection between the various levels of an electronic component. In that respect, either the holes can be only subsequently filled with a conductive material, or the through-platings which have been first applied are already conductive.

In the situation which does not involve a thin film which automatically breaks open, a break-through can be achieved at the through-plating locations by specifically targeted mechanical treatment.

At any event however in accordance with the invention the vias are applied prior to the central functional layer, that is to say generally an insulating layer, and the delicate, preferably structured layers remain spared by the through-plating process.

The term 'organic material' or 'functional material' or '(functional) polymer' includes here all kinds of organic, metallorganic and/or organic-inorganic plastic materials (hybrids), in particular those which are identified in English for example by 'plastics'. This involves all kinds of substances with the exception of the semiconductors which form the conventional transistors (germanium, silicon) and the typical metallic conductors. Restriction in a dogmatic sense to organic material as carbon-bearing material is accordingly not intended, but rather the broad use of for example silicones is also envisaged. In addition the term is not to be subjected to any restriction in regard to the molecule size, in particular to polymeric and/or oligomeric materials, but the use of small molecules is certainly also possible. The word component 'polymer' in the expression functional polymer is historically governed and in that respect does not make any statement about the presence of an actually polymeric bond.

Embodiments of the Invention are also described in greater detail hereinafter with reference to Figures showing cross-sectional profiles by way of example on an enlarged scale for the sake of improved clarity.

FIG. 1 shows a carrier substrate (for example a PET film) indicated at 1 with the corresponding lower conductor tracks 2 (for example gold, polyaniline, PEDOT, carbon black, graphite and conducting silver). The component comprises a plastic substrate which includes one of the following materials: PET, PP, PEN, polyimide, polyamide and coated paper.

FIG. 2 shows, in relation to the structure of FIG. 1, the free-standing through-plating 3 which is applied on a lower conductor track and/or layer 2. The through-plating 3 is applied for example by a printing procedure or lithographically. Any desired manner of manufacture which produces such a through-plating 3 on a lower layer 2 can be envisaged. The through-plating 3 comprises for example polyaniline, PEDOT, carbon black, graphite or conducting silver. It can however be provided of another conducting or non-conducting material. The shape of that through-plating 3 can be for example tower-shaped of a configuration which is tapered upwardly. The surface can have a certain degree of roughness, which promotes later contacting. As the substrate 1 and the conductor track or tracks 2 generally enjoy a high level of mechanical stability, a mass production process can be used without any problem for making the through-plating 3.

FIG. 3 again shows the same structure in another stage in the process, where two further layers 4 and 5 which can comprise semiconducting or insulating material have already been applied over the through plating 3 of FIG. 2 and form fillets with the through plating comprising the upwardly inclined raised portions of each layer at their junctions with the through plating. See also FIG. 4. The following for example can be used as semiconductor: polyalkthiophene or polyfluorene, while the insulator used can be for example polyhydroxystyrene, polymethylmethacrylate or polystyrene. By virtue of its size and/or its nature the through-plating 3 passes through the two central functional layers 4, 5 and thus forms the desired contact.

FIG. 4 shows the upper conductor track 6 on the structure known from the other Figures, and it can be seen that the through-plating 3 affords a conducting connection between the lower conductor track 2 and the upper conductor track 6.

FIG. 5 shows the same layer structure as that shown in FIGS. 1-3, except that in FIG. 5 the two functional layers 4 are restricted to one layer 4.

FIG. 6 shows two such structures as shown in FIG. 5, wherein one structure is turned through 180° so that the respective through-platings 3 are in mutually opposite relationship.

Figure 1:
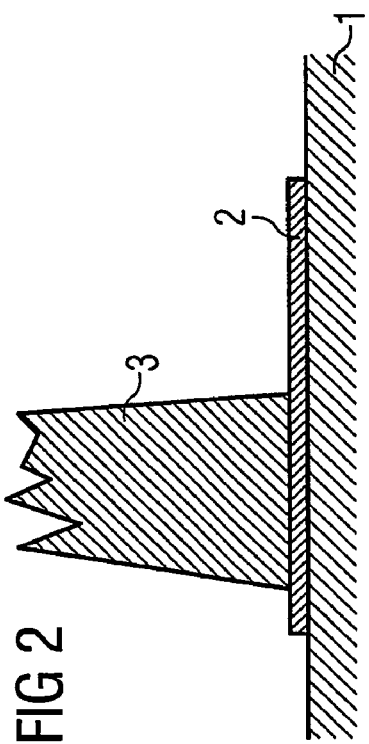
Figure 2:
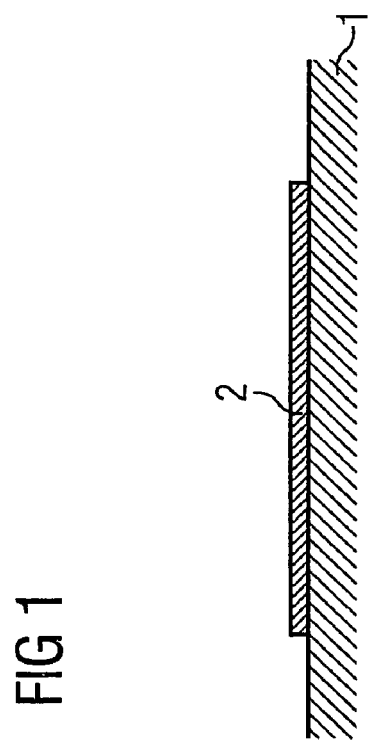
Figure 3:
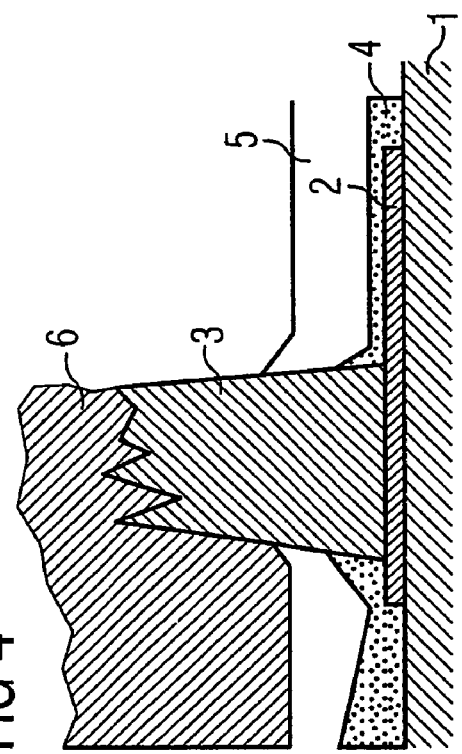
Figure 4:
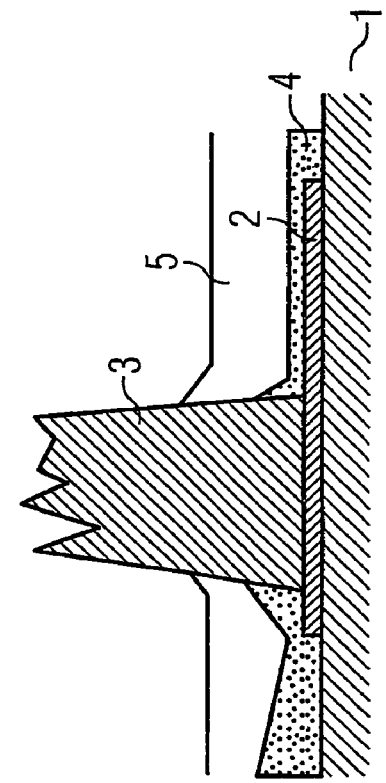

In FIG. 7, the two structures have been brought into contact with each other, as occurs, for example, in a lamination process. As a result, both the respective functional layers 4 and the respective vias form a unit and produce the defined electrical connection. The shape of the through-plating 3, which results in that case, can be recognized in the cross-sectional profile as a hyperboloid, that is to say, the shape of two truncated cones are joined 'head-to-head'.

FIG. 8 shows another way of producing the through-plating. A defined disruption 7 has been applied to the lower conductor track 2. The disruption 7 can comprise both conductive and also insulating material. In addition the disruption 7 can be produced by a local chemical or physical treatment. The through-plating 3 is shaped by tearing open the functional layer or layers 4 at the disruption 7 and subsequently filling the region around the disruption 7 with conductive material of the upper conductor track 6.

The disruption element 7, FIG. 8, provides that, around it, the subsequently applied central functional layer 4 tears open (as manifested by the larger region of the layer 6 contiguous with the layer 2 next adjacent to the disruption element 7). The conductor track 6 is shown mounted directly on the layer 2, due to non-wetting or in some other fashion, by the presence of the non-wetting disruption element 7 on the layer 2. Thus a region is produced around the disruption element 7, FIG. 8, comprising a void in the overlying layer(s), such as layer 4, due to the presence of the non-wetting disruption element 7, in which region the lower layer 2 to be contacted, as per FIG. 8, is exposed, in the operation of forming the upper layer conductor track 6 to be contacted.

The contacting of the conducting layer 2 to the conducting layer 6 functions by virtue of the exposed region on the layer 2 being larger than the disruption 7. For that reason the disruption 7 can comprise both conducting and also insulating material.

The through-plating 3 is therefore produced in such a way that, upon application of the semiconductor and insulator layer, the lower conductor layer 2 in FIG. 1 is locally not wetted. In other words, at the location of the vias, holes are deliberately produced in the layers which are to be through-plated. The actual through-plating 3 is then afforded by filling those holes with conductive material of the upper conductor track 6. That is effected for example automatically when applying the gate level.

The local non-wetting can also occur in such a way that a disruption is deliberately produced there, at which the film tears open and thus forms a hole. The disruption can be a material applied—by printing—, in which respect the natural shape of the material (particles) or the shape produced (point) promotes the process of tearing open the film. A further possibility for local non-wetting provides that there the physical/chemical properties of the surface are altered. The altered physical/chemical properties can be for example an increased level of surface energy, whereby from the outset no wetting of that location occurs, which again results in the same effect, namely hole formation. The increased level of surface energy is possible for example by applying by printing a chemical solution (solvent, acid, base, a reactive compound) and subsequent removal and/or independent evaporation.

A physical (local) treatment of the lower functional layer can be effected for example by roughening up, laser irradiation, plasma treatment (for example corona), UV irradiation, IR irradiation and/or thermal treatment.

It is also possible locally to apply for example a material (lacquer, wax . . . ) which has non-wetting properties or which prevents wetting (comparable to the foregoing disruption locations). The material can be removed again prior to or after application of the intermediate layers, wherein at the location of the through-plating there is a hole in the cover layer, and that hole is then filed with the conductive upper layer.

In the embodiment of the through-plating in the form of a raised portion with a conductive or non-conductive material, it is possible both for the tip of the raised portion to 'pierce' through the functional layer and also for it to be shorter than the thickness of the functional layer, that is to say a simple raised portion which does not pass through the functional layer. In any case in the gate electrode printing process which follows the formation of the vias the conducting components (lower and upper layer/conductor track 2 and 6) are brought into contact by pressure because the intermediate layers 4, 5 are comparatively thin.

With the fast processing speeds of a mass production process, mechanical stressing of the material being printed upon is extremely critical and as far as possible should be avoided. Direct processing of the insulating layer would cause uncontrollable defect locations. The possibility described herein for producing the vias for the first time permits integration of the through-plating operation in a mass production process.

The invention claimed is:

1. An electronic component comprising:
   a first plurality of layers including a second plurality of predominately organic functional layers, at least one of the first plurality of layers comprising a first lower layer and at least two others of the first plurality of layers forming at least two central layers; and
   at least one through plating comprising solely a truncated conical cross-sectional profile which extends from a wider cross-sectional profile region at, and contiguous with and overlying the first lower layer, and through at least the two central layers transversely to the two central layers to a narrower upper cross-sectional region spaced from the first lower layer, the at least one through plating truncated conical cross sectional profile extending at least in part below the two central layers and is electrically coupled to at least two layers of said first plurality of layers.

2. The component of claim 1 wherein the through plating is electrically conductive and is ohmically coupled to at least two of the second plurality of layers.

3. The component of claim 1 wherein a third plurality of layers are on the first lower layer and form upper layers, the through plating extending from the first lower layer through at least one upper layer.

4. The component of claim 1 wherein the first and second plurality of layers form further lower layers and upper layers, the through plating decreasing in diameter as the through plating extends from a lower layer to an upper layer.

5. The component of claim 1 wherein the through plating extends through each of a further plurality of layers different than the first lower layer and is coupled to each of the of the further plurality of layers though which the through plating extends.

6. The component of claim 1 wherein the through plating is solid.

7. An electronic component comprising:
a first plurality of layers of different materials, each layer of the first plurality of layers being contiguous with at least one other of the first plurality of layers, the first plurality of layers including a second plurality of predominately organic functional layers, at least one of the first plurality of layers is a first lower layer and at least two others of the first plurality of layers are central layers; and
at least one through plating comprising a solely truncated conical cross-sectional profile which extends from and overlies the first lower layer through at least the at least two central layers transversely to the central layers, the at least one through plating truncated conical cross section profile extending at least in part below the at least two central layer and is electrically coupled to at least two layers of said first and second plurality of layers.

8. The component of any one of claims 1 and 7 wherein the through plating forms a disruption element on the first lower layer arranged to result in a void in the at least two central layers in response to the at least two central layers being applied to the first lower layer and disruption element, the through plating forming and being disposed in the void.

9. The component of any one of claims 1 and 7 wherein the through plating forms a disruption element on and contiguous with the first lower layer, which through plating causes a void in the at least two central layers being applied subsequently to the through plating and to the lower first layer and which at least two central layers are contiguous with the through plating at their voids.

10. An electronic component comprising:
a first layer;
a disruption element comprising a truncated conical in cross section profile through plating that is solely truncated and located on a portion of the first layer over a given region of the first layer; and
a plurality of layers of different materials applied successively to the first layer, at least one of which plurality of layers is contiguous with the first layer and a further layer of the plurality of layers is contiguous with the one layer, at least a first portion of the plurality of layers comprising predominantly organic material;
the disruption element being arranged to result in a void that exposes the disruption element in at least one layer of a second portion of the plurality of layers in the area adjacent to the disruption element in response to the at least one layer of the second portion of the plurality of layers being applied to both the first layer and to the disruption element.

11. The component of claim 10 wherein the through plating is electrically interconnected to at least two of the plurality of layers.

12. The electronic component as set forth in claim 10 wherein the component comprises a plastic substrate which includes one of the following materials: PET, PEN, PP, polyimide, polyamide and coated paper.

13. The electronic component as set forth in claim 10 wherein the through plating comprises a free-standing raised portion of electrically conductive material and includes any one or more of the group consisting of polyaniline, PEDOT, carbon black, graphite, electrically conducting silver, a metal and a mixture thereof.

14. The electronic component as set forth in claim 10 wherein at least one of the plurality of layers is selected from the group consisting of an insulating material including polyhydroxystyrene, polymethylmethacrylate, and/or polystyrene, or a semiconducting material including polyalkylthiophene and polyfluorene and a mixture thereof.

15. The electronic component as set forth in claim 10 wherein the through-plating comprises a raised portion relative to the first layer that has a surface roughness which promotes ohmic contacting.

16. The electronic component as set forth in one of claims 13-15 wherein the first layer comprises a lower functional organic layer.

17. An electronic component comprising:
a first layer;
a disruption element comprising a carbon black layer on a portion of the first layer over a given region of the first layer; and
a plurality of layers of different materials applied successively to the first layer, at least one of which plurality of layers is contiguous with the first layer and a further layer of the plurality of layers is contiguous with the one layer, at least a first portion of the plurality of layers comprising predominantly organic material;
the disruption element being arranged to result in a void that exposes the disruption element in at least one layer of a second portion of the plurality of layers in the area adjacent to the disruption element in response to the at least one layer of the second portion of the plurality of layers being applied to both the first layer and to the disruption element.

18. A method of forming an electronic component comprising:
forming a lower layer;
forming a free-standing solely truncated conical cross-sectional profile through plating overlying and contiguous with the lower layer, the through plating extending and tapering from a lower cross sectional area at the lower layer to an uppermost cross sectional area smaller than the lower cross sectional area;
forming a plurality of further layers overlying and contiguous with the lower layer surrounded by and contacting the through plating extending therethrough, at least one of which further layers forms a central layer, at least two of which plurality of further layers are organic functional layers and at least one of which further layers forms a first upper layer; and forming a second upper layer overlying and contiguous with the first upper layer and with the through plating; wherein at least two of the layers are ohmically coupled to the through plating.

19. The method of claim 18 wherein the through plating comprises carbon black causing the through plating to function as a disruption element, which disruption element causes a void in the plurality of further layers being applied subsequently to the through plating and to the lower first layer and which plurality of further layers are contiguous with the through plating.

20. A process for the production of an electronic component comprising:

forming a plurality of layers of different materials including a first lower layer, a majority of which plurality of layers are of predominantly organic material and which plurality of layers includes an insulating layer;

the forming of the first lower layer being followed by forming subsequent layers of the plurality of layers deposited sequentially and contiguously with one on the other, at least one of the subsequently deposited layers being deposited contiguously onto the first lower layer;

forming a carbon black disruption element on the first lower layer, which element results in a void in at least one layer of the subsequently deposited layers; and ohmically coupling the at least two layers of the subsequently deposited layers to each other.

21. The process of claim 20 wherein the carbon black disruption element comprises a solely truncated conical cross section in profile through plating on the first lower layer.

* * * * *